(12) United States Patent
Betser et al.

(10) Patent No.: US 12,131,792 B2
(45) Date of Patent: Oct. 29, 2024

(54) ANALOG SIGNALS MONITORING FOR FUNCTIONAL SAFETY

(71) Applicant: Infineon Technologies LLC, San Jose, CA (US)

(72) Inventors: Yoram Betser, Mazkeret Batya (IL); Oleg Dadashev, Hadera (IL); Kobi Danon, Tel-Aviv (IL)

(73) Assignee: INFINEON TECHNOLOGIES LLC, San Jose, CA (US)

( * ) Notice: Subject to any disclaimer, the term of this patent is extended or adjusted under 35 U.S.C. 154(b) by 147 days.

(21) Appl. No.: 17/862,917

(22) Filed: Jul. 12, 2022

(65) Prior Publication Data

US 2023/0268023 A1   Aug. 24, 2023

Related U.S. Application Data

(60) Provisional application No. 63/311,693, filed on Feb. 18, 2022.

(51) Int. Cl.
*G11C 29/56* (2006.01)
*G11C 29/02* (2006.01)
*H03M 1/12* (2006.01)

(52) U.S. Cl.
CPC ...... *G11C 29/56004* (2013.01); *G11C 29/021* (2013.01); *G11C 29/56008* (2013.01); *H03M 1/1205* (2013.01)

(58) Field of Classification Search
CPC .............. G11C 29/56004; G11C 29/02; G11C 29/56008; H03M 1/1205
See application file for complete search history.

(56) References Cited

U.S. PATENT DOCUMENTS

| | | |
|---|---|---|
| 8,054,057 B2 * | 11/2011 | Dash ...................... G01R 31/40 323/282 |
| 8,604,961 B1 | 12/2013 | Bogner et al. |
| 9,804,207 B1 * | 10/2017 | Lesea ................. G01R 19/2509 |
| 9,823,282 B2 * | 11/2017 | Narayanan ......... G01R 31/3004 |
| 10,117,035 B2 * | 10/2018 | Coenen .................. H04R 25/43 |
| 10,862,492 B1 | 12/2020 | Huynh |
| 2016/0274546 A1 | 9/2016 | Kurose et al. |
| 2018/0323699 A1 | 11/2018 | Carpenter, Jr. et al. |
| 2020/0053306 A1 | 2/2020 | Cho et al. |

* cited by examiner

*Primary Examiner* — Vanthu T Nguyen
(74) *Attorney, Agent, or Firm* — Slater Matsil, LLP

(57) ABSTRACT

A method of operating a memory device includes: supplying one or more supply voltages to a memory array; and monitoring the one or more supply voltages, which includes: selecting, from the one or more supply voltages, a selected supply voltage; converting, using an analog-to-digital converter (ADC), an internal reference voltage of the memory device and a scaled version of the selected supply voltage into one or more digital values; generating a calibrated measurement result using the one or more digital values; and determining whether the calibrated measurement result is within a pre-determined range.

20 Claims, 5 Drawing Sheets

ANALOG SIGNALS MONITORING FOR FUNCTIONAL SAFETY

CROSS-REFERENCE TO RELATED APPLICATIONS

This application claims the benefit of U.S. Provisional Application No. 63/311,693, entitled "Analog Signals Monitoring for FuSa Applications," and filed on Feb. 18, 2022, which application is hereby incorporated herein by reference.

TECHNICAL FIELD

The present disclosure relates generally to an electronic system and method, and, in particular embodiments, to a circuit and method for analog signal monitoring for functional safety.

BACKGROUND

Memory devices, such as random access memory (RAM), read-only memory (ROM), flash memory, and so on, are widely used in electronic devices for storing application data and/or user data. To use the memory device, the electronic device may perform various memory access operations such as read, write, erase, and the like, to the memory array of the memory device.

Generally, in a memory device, one or more analog voltages and/or analog currents are provided or generated to drive the circuits for performing the various memory access operations. The signal levels of the analog signals (e.g., voltage values or current values) are crucial for proper functioning of the memory device. For example, to program (e.g., write, or erase) the memory array, a programming voltage at a nominal value or within a specified range from the nominal value is used to program the memory array. If the programming voltage deviates from the nominal value beyond an allowed range (e.g., a pre-determined range), the memory array may not be programmed properly. Similar, during a read operation on the memory array, electrical characteristics (e.g., current value, or voltage value) indicative of the stored digital value is measured and compared with a threshold to determine the digital value stored in the memory array. If the ready voltage for performing the read operation is out of an allowed range, the digital values stored in the memory array may not be read out correctly.

If the analog signals (e.g., analog voltages and/or analog currents) used in performing the memory access operations are not monitored and go out of range, the memory device may complete the memory access operations and report that the memory access operations completed successfully, without knowing that the analog signals are out of range. Large amount of data errors may occur when the analog signals used for memory access operations are out of range. When the amount of data errors exceeds the error correction/error detection capability of the error correction code (ECC) used in the memory device, the uncorrected/undetected data error may cause performance degradation at a system level. There is a need in the art for memory devices with built-in analogy signals monitoring function for improved system performance and efficient error reduction/prevention capability.

SUMMARY

In accordance with an embodiment, a memory device includes: a memory array comprising memory cells; and a power management circuit for the memory array, which includes: a voltage supply configured to provide one or more supply voltages to the memory array; an internal voltage reference configured to provide an internal reference voltage; a multiplexer configured to receive the one or more supply voltages and configured to output a selected supply voltage selected from the one or more supply voltages; an analog-to-digital converter (ADC) configured to convert the internal reference voltage and a scaled version of the selected supply voltage into one or more digital values; and a digital comparator. The digital comparator is configured to: generate a calibrated measurement result using the one or more digital values, a first stored digital value of the internal reference voltage, and a second stored digital value of an external reference voltage; compare the calibrated measurement result with a pre-determined range; and in response to detecting that the calibrated measurement result is outside the pre-determined range, set an error flag indicating a fault condition of the memory device.

In accordance with an embodiment, an integrated circuit (IC) device includes: a memory array comprising memory cells; a controller coupled to the memory array; and a power management circuit coupled to the memory array and the controller, the power management circuit comprising: a voltage supply circuit configured to provide supply voltages to the memory array; a multiplexer coupled to the voltage supply circuit and configured to output a selected supply voltage that is selected from the supply voltages; an internal voltage reference circuit configured to provide an internal reference voltage; an analog-to-digital converter (ADC) configured to convert the internal reference voltage and a scaled version of the selected supply voltage into ADC outputs; and a digital comparator. The digital comparator is configured to: generate a calibrated measurement result using the ADC outputs, a first pre-stored digital value of the internal reference voltage, and a second pre-stored digital value of an external reference voltage; determine whether the calibrated measurement result is within a pre-determined range; and in response to determining that the calibrated measurement result is outside the pre-determined range, set an error flag indicating a fault condition of the IC device.

In accordance with an embodiment, a method of operating a memory device includes: supplying one or more supply voltages to a memory array; and monitoring the one or more supply voltages, which includes: selecting, from the one or more supply voltages, a selected supply voltage; converting, using an analog-to-digital converter (ADC), an internal reference voltage of the memory device and a scaled version of the selected supply voltage into one or more digital values; generating a calibrated measurement result using the one or more digital values; and determining whether the calibrated measurement result is within a pre-determined range.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
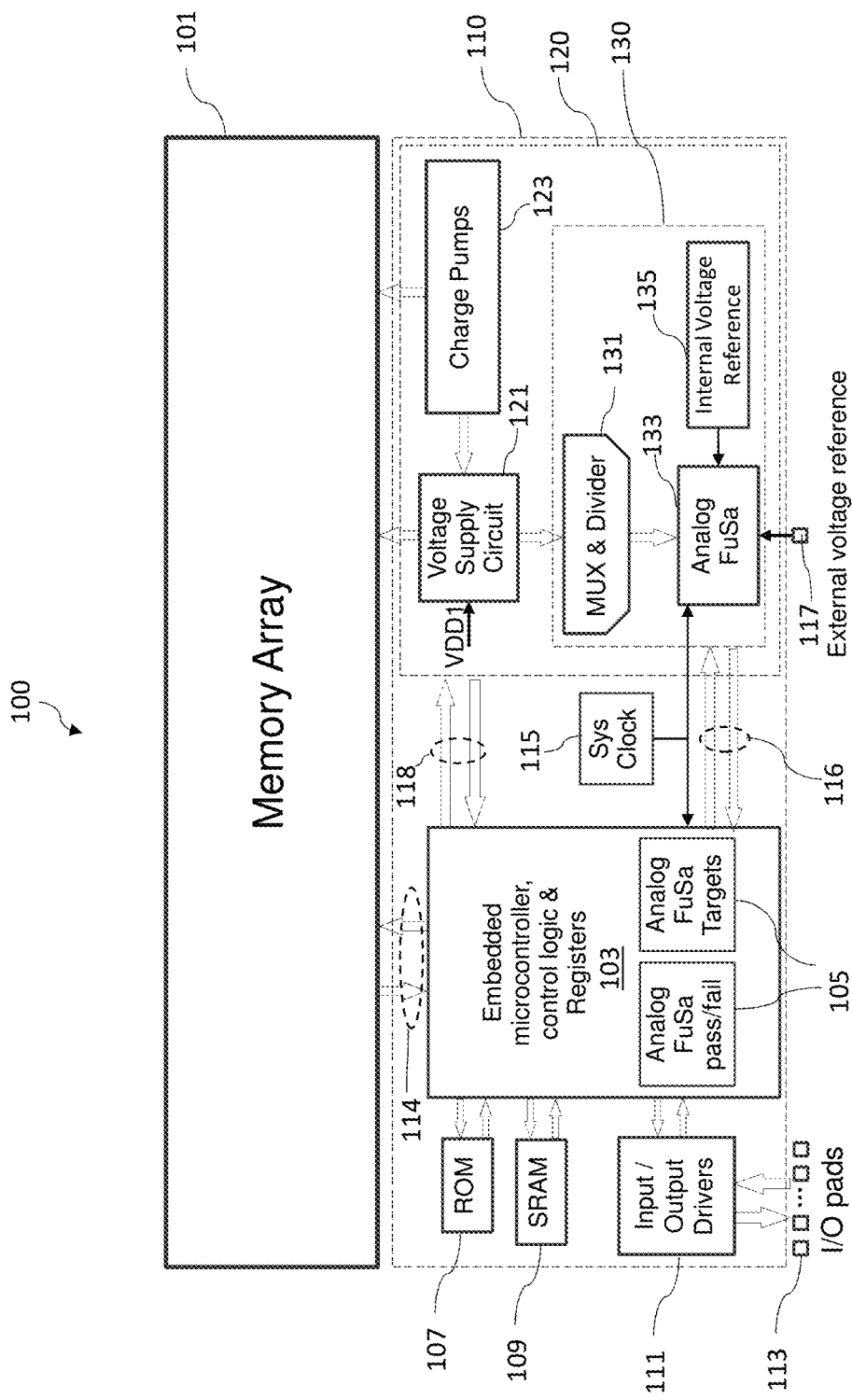
FIG. 1 illustrates a memory device with built-in analog signals monitoring function, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely analog signals monitoring in a memory device. One skilled in the art will readily appreciate that the principles disclosed herein may be applied to analog signals monitoring for other types of systems or applications.

FIG. 1 illustrates a memory device 100 with built-in analog signals monitoring function, in an embodiment. As illustrated in FIG. 1, the memory device 100 includes a memory array 101 and a memory control circuit 110. The memory control circuit 110 further includes a power management circuit 120, a controller 103, a system clock circuit 115, and an input/output (I/O) driver circuit 111, among other circuits. Details are discussed hereinafter.

The memory array 101 includes a plurality of memory cells for storing digital values (e.g., 0's and 1's) or analog values (e.g., multi-bit, multi-level memory cells). The memory array 101 may comprises any suitable type of memory cells, such as the 1-transistor 1-capacitor (1T1C) memory cells, split-gate (1.5 T) memory cells, 2-transistor memory cells, or the like. Each of the memory cells of the memory array 101 may store one or more bits of digital data. The memory cells may be organized in rows and columns, and may be addressable individually by address lines (e.g., bit lines, word lines) of the memory array 101. The addressing of the memory cells and the data transfer (e.g., read/write) to and from the memory cells may be controlled by the controller 103, e.g., through control signal/data paths 114 between the controller 103 and the memory array 101. Memory array is known in the art, thus details are not repeated here.

The controller 103 may be a micro-controller, a processor, a digital logic circuit, an application specific integrated circuit (ASIC), or the like. FIG. 1 illustrates a ROM module 107 and a static random access memory (SRAM) module 109 coupled to the controller 103. The ROM modulate 107 and the SRAM module 109 are used to store programs (e.g., computer codes) that are run by the controller 103, and/or program data or user data that are used by the controller 103. The controller 103 may have a plurality of registers 105 or other types of memory components, which may be used to store target values (e.g., target nominal values, or ranges around a nominal value) for the analog signal (e.g., voltages or currents) that are used for the memory access operations, or may be used to store the pass/fail results for analog signals monitoring. The system clock circuit 115 generates one or more system clocks that are used to drive the controller 103 and the power management circuit 120.

FIG. 1 further illustrates the I/O driver circuit 111, which is coupled between the controller 103 and I/O pad 113 of the memory device 100. The I/O driver circuit 111 may be used to improving the driving capability of the controller 103, and/or may be used to convert the signal levels (e.g., voltages levels) between the I/O voltages of the controller 103 and the I/O voltages applied at the I/O pads 113. The I/O pads 113 allow for communication between the controller 103 and an external device (e.g., another processor or another device). In some embodiments, the target values for the analog signals (e.g., voltages or currents) that are used for the memory access operations are received by the controller 103 through the I/O pads 113. In some embodiments, the pass/fail results for analog signals monitoring are output at the I/O pads 113.

Still referring to FIG. 1, the memory device 100 includes the power management circuit 120 coupled to the controller 103 through, e.g., control signal/data paths 116 and 118. In some embodiments, the power management circuit 120 includes circuits for generating one or more supply voltages (or supply currents) that are used in memory access operations. In addition, the power management circuit 120 includes circuits for monitoring the supply voltages (or supply currents). In the discussion here, monitoring the supply voltages (or supply currents) may be referred to as analog signals monitoring. The discussion herein uses examples where the analog signals being monitored are supply voltages, with the understanding that the principle disclosed therein may be easily applied for monitoring any supply current, e.g., by monitoring the voltage drop across a fixed (e.g., known) resistor through which the supply current flows.

As illustrated in FIG. 1, the power management circuit 120 includes a voltage supply circuit 121, which generates one or more supply voltages (e.g., having different voltage values, such as +1V, +1.5V, +3V, or the like) used for, e.g., memory access operations or the operation of other circuits of the memory device 100. The voltage supply circuit 121 may include, e.g., DC-DC power converters, low-drop power regulators, or the like. In some embodiments, the DC-DC power converters of the voltage supply circuit 121 convert an analog voltage VDD1 into one or more different DC voltages for use in memory access operations. The analog voltage VDD1 is an external input voltage signal to the memory device 100, in an example embodiment. FIG. 1 further illustrates a charge pump 123, which is coupled to the memory array 101 and/or the voltage supply circuit 121. In some embodiments, using the analog voltage VDD1 (e.g., a +3V external voltage signal), the charge pump 123 generates one or more high voltages (e.g., +10V), while the voltage supply circuit 121 generates one or more low voltages (e.g., +1V, +1.5V, +3V) for use by the memory device 100. In the discussion herein, unless other specified, the voltage provided by the charge pump 123 is not distinguished from the supply voltages provided by the voltage supply circuit 121, and all the voltages supplied to the memory array 101 are collectively referred to as one or more supply voltages for the memory array 101 (or for the memory access operations). Note that in embodiments where supply currents are used to drive the memory array 101 for memory access operations, the voltage supply circuit 121 may be replaced by a current supply circuit that generates one or more supply currents. Therefore, the voltage supply circuit 121 may also be referred to generically as a power supply circuit.

The voltages used for memory access operations are sent to an analog signals monitoring circuit 130 of the power management circuit 120. As illustrated in FIG. 1, the analog signals monitoring circuit 130 includes a MUX & divider circuit 131, an internal voltage reference 135, and an analog functional safety circuit 133. The internal voltage reference 135 is a circuit that provides an internal reference voltage (e.g., a fixed, known voltage). In an embodiment, the internal voltage reference 135 is a bandgap voltage reference that provides a reference voltage of, e.g., 1.25 V. In some embodiments, the MUX & divider circuit 131 includes a multiplexer (MUX) 132 (see FIG. 2) that chooses (e.g., selects), from the one or more supply voltages, a selected supply voltage for monitoring. The MUX & divider circuit 131 further includes a scaling circuit 134 (see FIG. 2) that scales the selected supply voltage by a scaling factor, such that the voltage at the output of the scaling circuit is within a measuring range of a subsequent analog-to-digital converter (ADC). The analog functional safety circuit 133 includes an ADC 137 (see FIG. 2) and a digital comparator 139 (see FIG. 2). Details of the analog signals monitoring circuit 130 are discussed below with reference to FIG. 2.

In some embodiments, the control signal/data paths 118 are used for transferring control signals and data between the controller 103 and the voltage supply circuit 121. For example, depending on the type/structure of the memory array 101, the controller 103 may use the control signal/data paths 118 to control the voltage levels and the dynamic behavior (e.g., timing sequence) of the supply voltages generated by the voltage supply circuit 121. In some embodiments, the control signal/data paths 116 are used for transferring control signals and data between the controller 103 and the analog signals monitoring circuit 130. Various control signals and data transferred between the controller 103 and the analog signals monitoring circuit 130 are discussed hereinafter.

Figure 2:
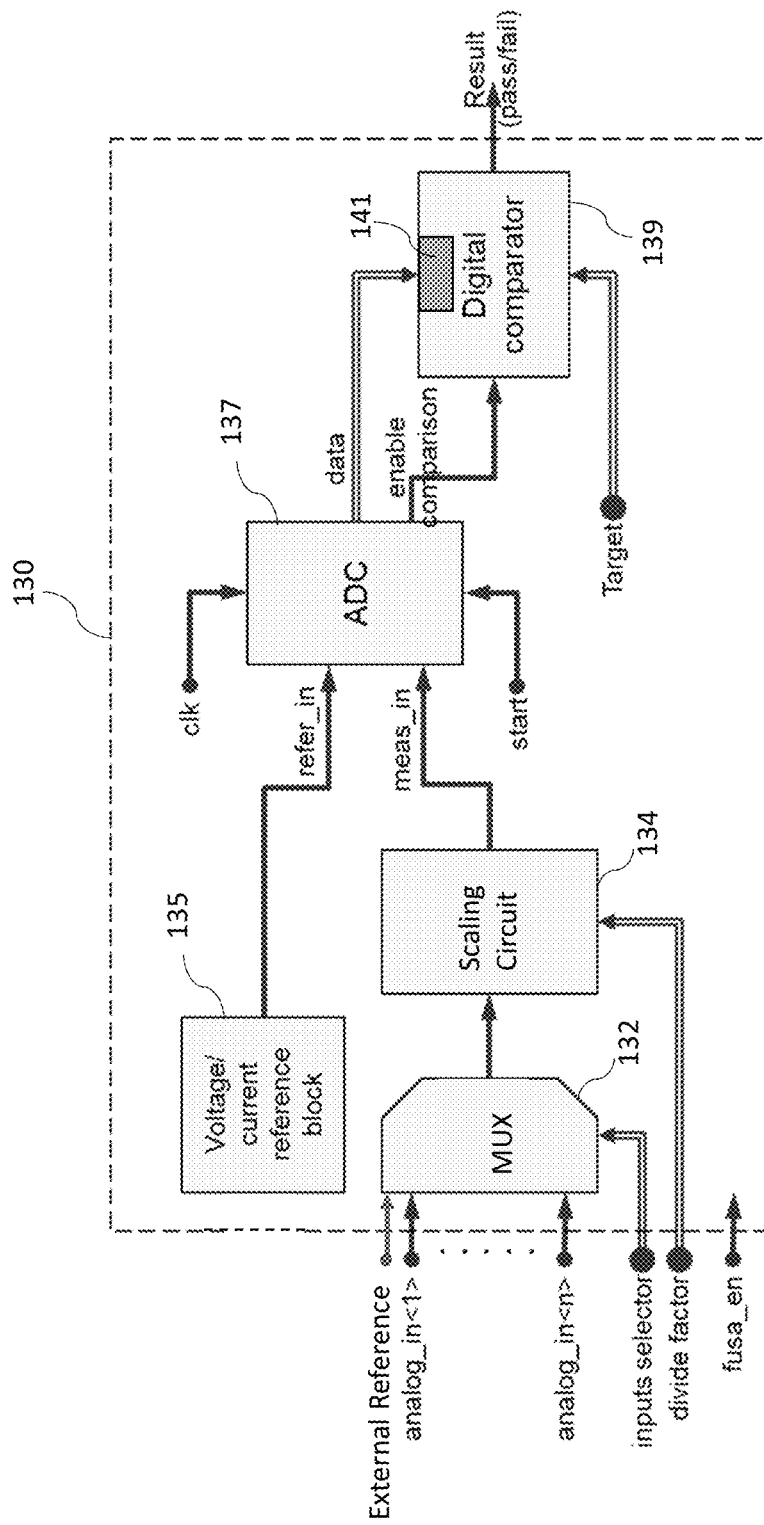
FIG. 2 illustrates a block diagram of an analog signals monitoring circuit, in an embodiment.

FIG. 2 illustrates a block diagram of the analog signals monitoring circuit 130 of FIG. 1, in an embodiment. In the example of FIG. 2, the analog signals monitoring circuit 130 includes the internal voltage reference 135, the MUX 132 (e.g., an analog MUX), the scaling circuit 134 (may also be referred to as a divider), the ADC 137, and the digital comparator 139. An enable signal (labeled as "fusa_en" in FIG. 2) functions as the enable signal for the analog signals monitoring circuit 130. The MUX 132 accepts N analog signals (labeled as analog_in<1>, . . . , analog_in<n> in FIG. 2), such as the one or more supply voltages, to be monitored. In the example of FIG. 2, the MUX 132 further accepts an external reference signal (labeled as "external reference" in FIG. 2) as an input signal. The external reference signal may be used to generated a pre-stored digital value of an external reference voltage during factory testing, details of which are discussed hereinafter. The MUX 132 may also accept other analog signals of the memory device 100 for monitoring. The MUX 132 is controlled by a control signal (labeled as "inputs selector" in FIG. 2) to select which of the analog signals is sent to the output of the MUX 132 as the selected analog signal (e.g., a selected supply voltage). The control signal of the MUX 132 may be generated by the controller 103 and sent to the analog signals monitoring circuit 130 through the control signal/data paths 116, as illustrated in FIG. 1.

The output of the MUX 132 is sent to an input terminal of the scaling circuit 134, which scales (e.g., divides, or multiplies) the output of the MUX 132 by a scaling factor. The scaling factor of the scaling circuit 134 is selected by a control signal (labeled as "divide factor" in FIG. 2), which may be generated by the controller 103 and sent to the analog signals monitoring circuit 130 through the control signal/data paths 116. Since the input analog signals to the MUX 132 may span a wide range of signal levels (e.g., voltage values, or current values), a proper scaling factor is chosen by the controller 103 in accordance with the signal level of the selected analog signal at the output of the MUX 132, such that the signal level of the selected analog signal at the output of the scaling circuit 134 is within an input range of the ADC 137. In some embodiments, the scaling factor is chosen such that the scaled selected analog signal at the output of the scaling circuit 134 is at an optimum or near-optimum level for the ADC 137, e.g., at about 80% of the maximum input signal level of the ADC 137 to maximize the signal-to-noise ratio (SNR) of the ADC output while leaving some top room to avoid saturation of the ADC output.

In FIG. 2, the ADC 137 accepts the output of the internal voltage reference 135 as a first measurement input (labeled as "refer_in" in FIG. 2), and accepts the scaled selected analog signal from the scaling circuit 134 as a second measurement input (labeled as "meas_in" in FIG. 2). In some embodiments, although not shown, a multiplexer may be included in the ADC 137 to select, e.g., the first measurement input then the second measurement input as the input to the ADC 137, such that the first measurement input and the second measurement input are converted by the ADC 137 into digital values sequentially. In some embodiments, the first measurement input and the second measurement input are used as a pair of differential input signals to the ADC 137 and the pair of differential signals is converted by the ADC 137 into digital values. In some embodiments, the ADC 137 may include two parallel ADC circuits, each of which is coupled to a respective one of the first measurement input and the second measurement input, such that the first measurement input and the second measurement input are converted into digital values in parallel. These and other variations are possible, and are fully intended to be included within the scope of the present disclosure. As a non-limiting example, the discussion below uses an example where each of the first measurement input and the second measurement input is converted into a respective digital value, with the understanding that principle disclosed herein may be modified for other variations.

To monitor the selected analog signal, the ADC 137 converts the first measurement input into a first digital value (also referred to as a first ADC output), and converts the second measurement input into a second digital value (also referred to as a second ADC output). The first digital value and the second digital value from the ADC 137 are, e.g., 16-bit binary digital words for a 16-bit ADC. The first digital value and the second digital value are sent to the digital comparator 139 for processing. FIG. 2 shows a clock signal (labeled as "clk" in FIG. 2) for driving the ADC 137, and a control signal (labeled as "start" in FIG. 2) for staring (e.g., enabling) the ADC 137. The clock signal may be generated by the system clock circuit 115 and sent to the analog signals monitoring circuit 130, and the control signal of the ADC 137 may be generated by the controller 103 and sent to the analog signals monitoring circuit 130 through the control signal/data paths 116.

The output of the ADC 137 (e.g., the first digital value and the second digital value) is sent to the digital comparator 139 through a data path (labeled as "data" in FIG. 2) between the output of the ADC 137 and the input of the digital comparator 139. FIG. 2 further illustrates an enable signal (labeled as "enable comparison" in FIG. 2) generated by the ADC 137, which is sent to the digital comparator 139 to enable comparison of a measurement result generated by the digital comparator 139 with a target value.

The digital comparator 139 includes a data processing circuit 141, which data processing circuit 141 generates a calibrated measurement result using the output of the ADC 137 (e.g., the first digital value and the second digital value), a first pre-stored digital value of the internal reference voltage, and a second pre-stored digital value of an external reference voltage. The first pre-stored digital value and the second pre-stored digital value may be stored in registers of the digital comparator 139 during factory testing of the memory device 100. Details for generating the calibrated measurement result are discussed hereinafter with reference to FIG. 4.

The calibrated measurement result corresponds to a metric that indicates the value (e.g., voltage value) of the selected analog signal. As a non-limiting example, the calibrated measurement result may correspond to (e.g., be proportional to) a difference between the value of the selected analog signal and the value of the internal reference voltage, or may correspond to a ratio between the value of the selected analog signal and the value of the internal reference voltage.

The digital comparator 139 compares the calibrated measurement result with a target value (labeled as "target" in FIG. 2), and the comparison result is used to set an error flag that indicates a "pass" or "fail" of the monitored analog signal, where a "pass" means the monitored analog signal is at the target value (or within a pre-determined range from the target value), and a fail means the monitored analog signal is not at the target value (or is not within a pre-determined range from the target value). The target value (which may be a pre-determined value or a range around a pre-determined value) may be sent from the controller 103 to the analog signals monitoring circuit 130 through the control signal/data paths 116. Note that the target value takes into account the scaling factor of the scaling circuit 134, in some embodiments. The output of the digital comparator 139 (e.g., pass/fail result) is sent back to the controller 103 through the control signal/data paths 116, in some embodiments, and may be saved in the register 105 of the controller 103.

In some embodiments, after a first analog signal is selected and monitored (e.g., converted by the ADC 137 and processed by the digital comparator 139 to find "pass/fail" result), the controller 103 chooses a second analog signal as the output of the MUX 132, in order to monitor the second analog signal. The process repeats until all or at least all of a selection of the analog signals at the input of the MUX 132 are monitored, in some embodiments.

Figure 3:
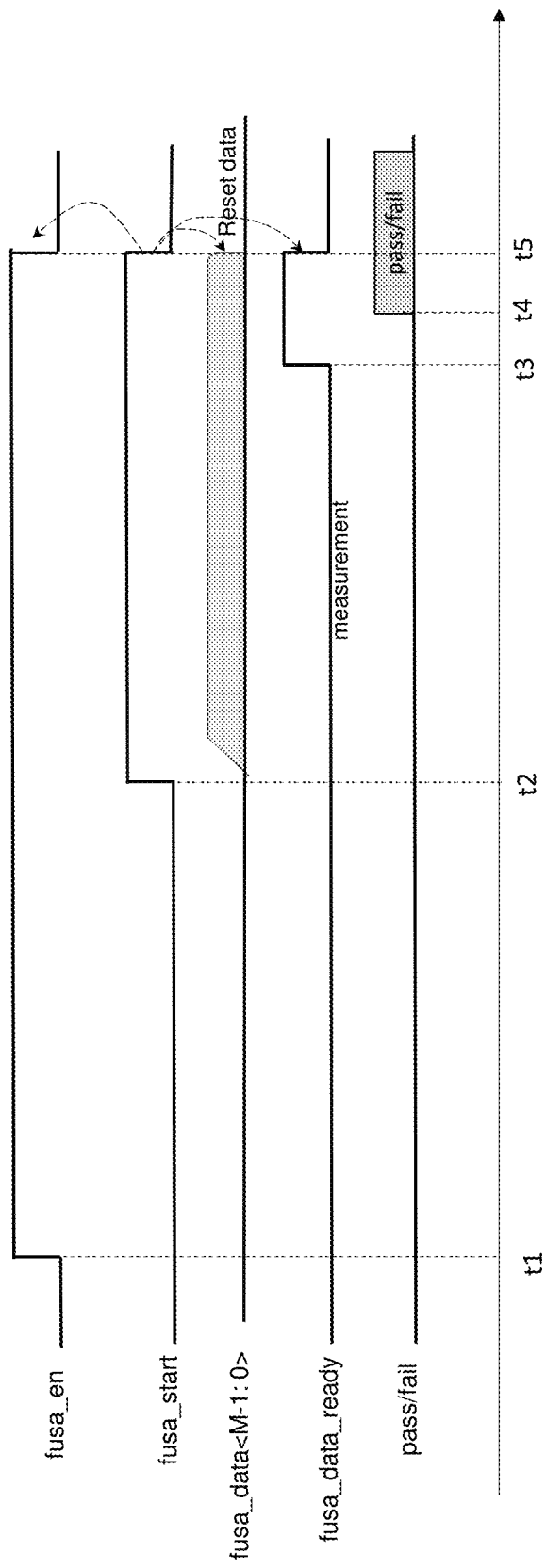
FIG. 3 illustrates a timing diagram of the analog signals monitoring circuit of FIG. 2, in an embodiment.

FIG. 3 illustrates a timing diagram of the analog signals monitoring circuit 130 of FIG. 2, in an embodiment. As illustrated in FIG. 3, at time t1, control signal fusa_en (which corresponds to the control signal "fusa_en" in FIG. 2) rises from low to high to enable the analog signals monitoring circuit 130. After the control signal fusa_en rises to high, after a period of time (e.g., a pre-determined duration), after time t2, the control signal fusa_start (which corresponds to the control signal "start" in FIG. 2) rises from low to high, thus enabling the ADC 137. The ADC 137 starts outputting digital samples after time t2. The ADC outputs are shown as an M-bit data signal fusa_data<M-1:0> in FIG. 3, which correspond to data signal "data" in FIG. 2. Depending on the type/structure of the ADC 137, after a certain period of time (e.g., a pre-determined duration), at time t3, the control signal fusa_data_ready (which corresponds to the control signal "enable comparison" in FIG. 2) rises from low to high, signaling that the ADC output signal fusa_data<M-1:0> is valid and ready to be used for comparison, and the digital comparator 139 starts processing the ADC output signal. At time t4, the output signal pass/fail of the digital comparator 139 (which corresponds to the "Result" signal in FIG. 2) is ready. Next, at time t5, control signal fusa_start drops from high to low, signaling the end of the monitoring of the current selected analog signal. The falling edge of the control signal fusa_start causes the control signal fusa_en to fall from high to low, and resets the ADC output signal fusa_data<M-1:0> and the output signal fusa_data_ready. The analog signals monitoring circuit 130 is now ready to process the next selected analog signal.

In some embodiments, the memory device 100 of FIG. 1 is implemented as an integrated circuit (IC) formed on a semiconductor substrate (e.g., silicon) using semiconductor manufacturing techniques. The IC device may also be referred to as a semiconductor die, or a semiconductor chip. In some embodiments, portions of the memory device 100, such as the memory array 101 and the power management circuit 120, are integrated into an IC device, and the controller 103 is not integrated into the IC device, which allows for user choice of different controller 103 in the semiconductor device 100. Different levels of integration for the IC device are possible and are fully intended to be included within the scope of the present disclosure.

Figure 4:
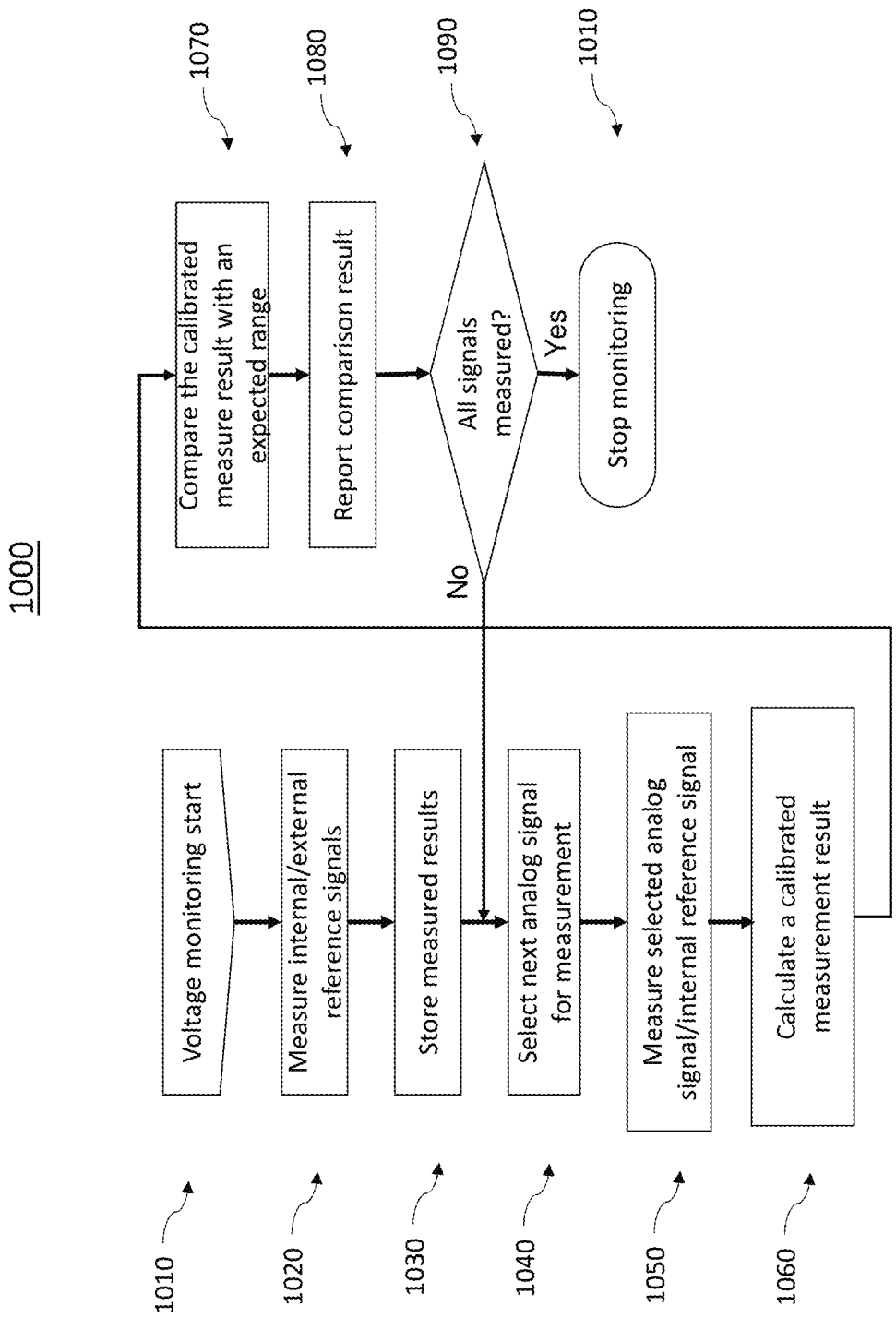
FIG. 4 illustrates a flow chart of a method for monitoring analog signals, in an embodiment.

FIG. 4 illustrates a flow chart of a method 1000 for monitoring analog signals, in an embodiment. At block 1010, the voltage monitoring starts. At block 1020, during factory testing of the memory device 100, the internal reference voltage provided by the internal voltage reference 135 is measured, e.g., converted by the ADC 137 into a digital value $A_{sort}$, and an external reference voltage is also measured, e.g., converted by the ADC into a digital value $K_{sort}$. At block 1030, the measured results (e.g., the digital values $A_{sort}$ and $K_{sort}$) obtained in block 1020 are stored in the memory device 100 (e.g., in registers of the digital comparator 139) as pre-stored digital values (e.g., a first pre-stored digital value $A_{sort}$ of the internal reference voltage, and a second pre-stored digital value $K_{sort}$ of the external reference voltage). These pre-store digital values will be used in calculating the calibrated measurements result in subsequent processing.

Note that in some embodiments, the processing in blocks 1020 and 1030 may be performed only once, during factory testing (may also be referred to as a sorting process) of the memory device 100. Here, factory testing refers to the device testing/qualification process (e.g., a quality control process) performed at the factory where the memory device 100 is manufactured, before the memory device 100 is shipped out and deployed in the field (e.g., used in an electronic device comprising the memory device 100). During the processing of block 1020, the external reference voltage is generated by a highly accurate external voltage reference (e.g., a lab testing equipment used during factory testing that provides a known, calibrated, highly accurate reference voltage). The external reference voltage, which has a higher accuracy (e.g., deviates less from its nominal value) than the internal reference voltage, is applied at input terminal 117 (see FIG. 1) of the memory device 100 and sent to the MUX 132 as the external reference signal (see label "external reference" in FIG. 2). The MUX 132 selects the external reference signal during factory testing as the output signal to the ADC 137, and the ADC 137 converts the external reference voltage into the digital value $K_{sort}$.

In some embodiments, the digital value $K_{sort}$ is used to calculate the actual internal reference voltage provided by the internal voltage reference 135. As a non-limiting example, consider a scenario where the internal voltage reference 135 is designed to produce an internal reference voltage with a nominal value of, e.g., 1.25 V. However, due to manufacturing limitations and other non-ideal conditions, the actual internal reference voltage $V_{INT}$ provided by the internal voltage reference 135 deviates from this nominal value and is unknown. To find an estimate of the actual internal reference voltage $V_{INT}$, denote the external reference voltage provided during factory testing as $V_{EXT}$, then the actual internal reference voltage $V_{INT}$ may be calculated by $$V_{INT} = A_{sort} \times V_{EXT}/K_{sort} \qquad (1)$$

The processing in blocks 1040 to 1090 are performed after the memory device 100 is deployed in the field, e.g., when an electronic device comprising the memory device 100 is monitoring the analog signals during operation. In block 1040, one of the analogy signals at the input of the MUX 132 is selected and sent to the ADC 137 for measurement. In block 1050, the selected analog signal (e.g., a supply voltage provided by the voltage supply circuit 121) from the MUX 132, after being scaled by the scaling circuit 134, is converted into a digital value B by the ADC 137, and the internal reference voltage provided by the internal voltage reference 135 is converted by the ADC 137 into a digital value A. Note that the internal reference voltage is measured again here, in order to compensate for various factors, such as component aging, temperature induced drift, or the like, which may cause the internal reference voltage to drift over time. Details are discussed in the processing of block 1060.

Next, in block 1060, a calibrated measurement result is calculated using the digital value A for the internal reference voltage, the digital value B for the selected analog signal (e.g., the scaled selected supply voltage), the first pre-stored digital value $A_{sort}$ of the internal reference voltage, and the second pre-stored digital value $K_{sort}$ of the external reference voltage in a conversion function $f(A, B, A_{sort}, K_{sort})$, as discussed below.

The digital values A and B measured during operation of the memory device 100 may include un-controllable/un-predictable errors caused by factors such as component aging, temperature induced measurements drifting, or the like. In addition, the internal voltage reference may not be perfect (e.g., the internal reference voltage is not exactly at the nominal value of 1.25 V), and the internal reference voltage may or may not drift over time. To remove or reduce the un-controllable/un-predictable errors, the digital values A and B are used together with the first pre-stored digital value $A_{sort}$ and the second pre-stored digital value $K_{sort}$ in the conversion function $f(A, B, A_{sort}, K_{sort})$ to compute the calibrated measurement result. An example of the conversion function $f(A, B, A_{sort}, K_{sort})$ is given in Equation (4) below.

In some embodiments, the first pre-stored digital value $A_{sort}$ and the second pre-stored digital value $K_{sort}$ are used to reduce errors in the digital values A and B, or other related values (e.g., the calibrated measurement result). As an example, given a digital value A of the internal reference voltage (which may or may not drift over time) measured when the n-th analog signal is selected by the MUX 132, a calibrated value $V_{INT}(n)$ for the internal reference voltage may be calculated by $$V_{INT}(n) = A \times V_{INT}/A_{sort} \qquad (2)$$

where n=1, ..., N, n is the index of the selected analog signal, and N is the total number of analog signals at the input of the MUX 132. Note that the calibrated value $V_{INT}$ (see Equation (1)) includes contribution from the first pre-stored digital value $A_{sort}$ and the second pre-stored digital value $K_{sort}$. Equation (2) may compensate for drifting of the internal reference voltage to achieve better accuracy for the measured internal reference voltage value.

Similarly, a calibrated value $V_B$ for the selected analog signal (e.g., the selected supply voltage) may be calculated by:

$$V_B = B \times V_{INT}/A_{sort} \qquad (3)$$

The calculations shown in Equations (2) and (3) are merely non-limiting examples to use the first pre-stored digital value $A_{sort}$ and the second pre-stored digital value $K_{sort}$ to improve measurement values. Other ways are also possible, and are fully intended to be included within the scope of the present disclosure.

As discussed previously, the calibrated measurement result corresponds to a metric that indicates the value (e.g., voltage value) of the selected analog signal, such as a difference, or a ratio, between the value of the selected analog signal and the value of the internal reference voltage, as examples. Depending on, e.g., the structure/implementation of the various circuits in the IC device 100, different ways to calculate the calibrated measurement result are possible, as skilled artisans readily appreciate. As a non-limiting example, the calibrated measurement result, denoted as CMR, may be calculated by:

$$CMR = K \times \left(\frac{A+B}{A}\right) \times \left(\frac{A_{sort}}{A_{sort} + K_{sort}}\right) \qquad (4)$$

where K is a constant. Besides the example of Equation (4), other ways to calculate the calibrated measurement result CMR are possible, and are fully intended to be included within the scope of the present disclosure.

Next, in block 1070, the calibrated measurement result CMR computed in block 1060 is compared with an expected range to decide whether the signal level (e.g., voltage value) of the selected analog signal is within the expected range. The expected range for the selected analog signal may be saved as a target value(s) in the registers 105 of the controller 103 and sent to the analog signals monitoring circuit 130 by the controller 103. For example, the digital comparator 139 may compare the calibrated measurement result CMR with the expected range, and if the calibrated measurement result CMR is within the expected range ($Range_{low} \leq CMR \leq Range_{high}$), the digital comparator 139 declares a "pass" status for the selected analog signal, otherwise, the digital comparator 139 declares a "fail" status for the selected analog signal, where $Range_{low}$ and $Range_{high}$ are the lower bound and the upper bound of the expected range. In other words, the digital comparator 139 sets an error flag to "1" if the calibrated measurement result is out of the expected range.

Next, in block 1080, the "pass" or "fail" result is reported by the digital comparator 139 to the controller 103, e.g., through the control signals/data path 116. In some embodiments, the controller 103 initiates an error recovery operation in response to receiving an error flag, e.g., by repeating the last memory access operation and monitoring the analog signals to ensure the analog signal levels are within the target ranges, or by resetting the memory device 100 or resetting the power management circuit 120.

Next, in block 1090, the controller 103 checks if all analog signals at the input of the MUX 132 are tested (e.g., monitored). If not, the processing goes back to block 1040, where the controller 103 selects the next analog signal at the input of the MUX 132 as the selected analog signal for testing. The processing continues until all the analog signals at the input of the MUX 132 are tested. Next, in block 1010, the monitoring is stopped. Note that the processing between blocks 1040 and 1090 may be started again when the controller 103 instructs the power management circuit 120 to do so.

The analog signals monitoring disclosed herein reduces or prevents data error at a low-level processing of the electronic device, e.g., during memory access operations. This advantageously provides early detection of data errors, reduces or prevents catastrophic data errors (e.g., long sequences of data errors during memory access), and allows for early error recovery operation to improve system performance and reduce latency. Data stored in memory arrays are generally protected by error correction code (ECC). The ECC provides certain degree of protection against data error. For example, the ECC may be designed to detect/correct certain number of bit errors for a specific data size. However, when a burst error (e.g., long sequence of bit error) happens, which is likely when the analog signal (e.g., supply voltage) used for memory access is out of the specified range, the ECC would not be able to detect or correct the errors. In fact, without the disclosed analog signal monitoring, the electronic device may think that memory access operations are completed successfully, while in reality, the analog signals used for memory access are out of the specified ranges and are causing long sequences of errors in the data being read or written. If the data with long sequences of errors are used by an application running on the electronic device, serious performance degradations or system failure may occur. Even if the data error is detected at high level of processing, e.g., in the application running on the electronic device, data recovery operation (e.g., re-writing, re-reading, or re-transmission) initiated by the application may cause longer delay in the processing, higher computational complexity, or higher power consumption. In contrast, the disclosed analog signal monitoring, by monitoring the analog signals at the memory access level, allows for early detection of data errors and early error recovery operation, thereby reducing processing delay, computational complexity, and power consumption of the electronic device.

The circuits and method for analog signals monitoring disclosed herein may be performed at different stages of operation of the memory device 100. For example, the analog signals monitoring may be performed during a dedicated calibration process or a test mode when no memory access operation is performed. As another example, the analog signals monitoring may be performed regularly, e.g., at a lower frequency, such as every 10 ms, every 100 ms, or the like, to periodically check the signals levels of the analog signals. As another example, the analog signals monitoring may be performed when the controller 103 issues a command to instruct the power management circuit 120 to perform the analog signals monitoring. As yet another example, the analog signals monitoring may be performed as an embedded operation, e.g., performed automatically in parallel to every memory access operation. These and other variations are fully intended to be included within the scope of the present disclosure.

Figure 5:
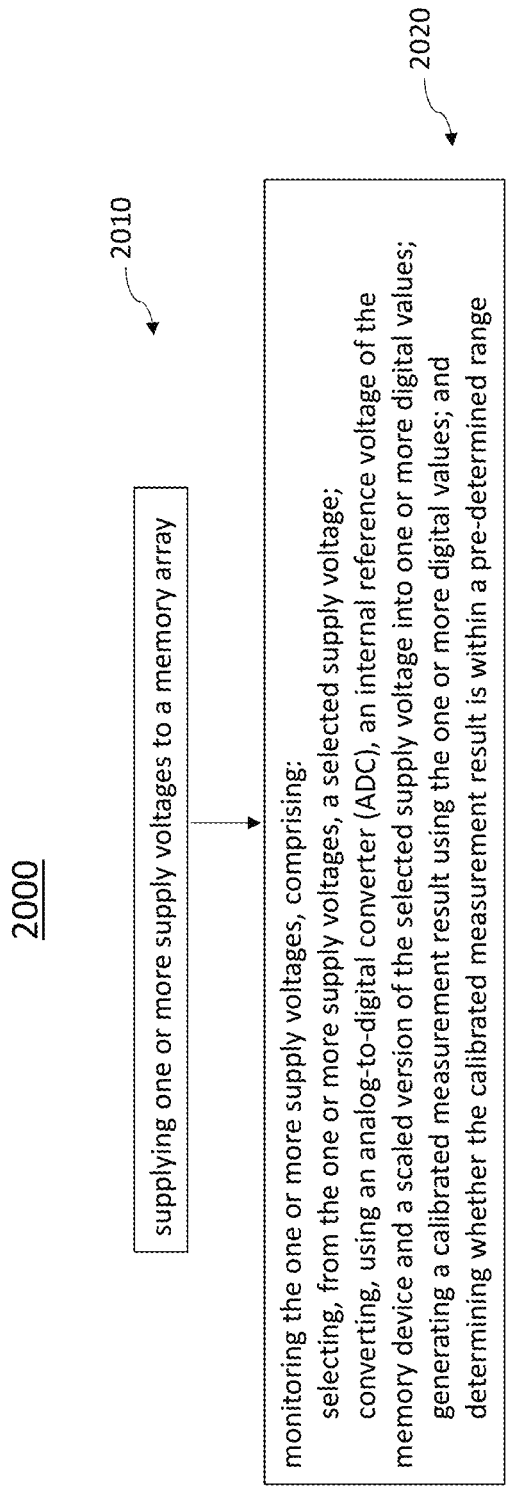
FIG. 5 illustrates a flow chart of a method for operating a memory device, in an embodiment.

FIG. 5 illustrates a flow chart of a method 2000 of operating a memory device, in some embodiments. It should be understood that the example method shown in FIG. 5 is merely an example of many possible example methods. One of ordinary skill in the art would recognize many variations, alternatives, and modifications. For example, various steps as illustrated in FIG. 5 may be added, removed, replaced, rearranged, or repeated.

Referring to FIG. 5, at block 2010, one or more supply voltages are supplied to a memory array. At block 2020, the one or more supply voltages are monitored, wherein the monitoring comprises: selecting, from the one or more supply voltages, a selected supply voltage; converting, using an analog-to-digital converter (ADC), an internal reference voltage of the memory device and a scaled version of the selected supply voltage into one or more digital values; generating a calibrated measurement result using the one or more digital values; and determining whether the calibrated measurement result is within a pre-determined range.

Embodiments may achieve advantages as described below. In the disclosed embodiments, the analog signals used for memory access operations are checked (e.g., monitored) to determine if the signal levels of the analog signals are within specified ranges. An corresponding error flag is set if an analog signal is outside the specified range. The memory device with the built-in analog signals monitoring function is able to detect data errors early in the processing chain, and may be able to reduce or prevent data errors by initiating error recovery operation early when needed, which may reduce processing delay, processing complexity and power consumption of the memory device. In addition, the disclosed method uses pre-stored values for an external reference voltage and the internal reference voltage, stored at factory testing, to generate calibrated measurement result, which improves accuracy of the measurement values and achieves better analog signals monitoring results.

Examples of the present invention are summarized here. Other examples can also be understood from the entirety of the specification and the claims filed herein.

Example 1. In an embodiment, a memory device comprises: a memory array comprising memory cells; and a power management circuit for the memory array, comprising: a voltage supply configured to provide one or more supply voltages to the memory array; an internal voltage reference configured to provide an internal reference voltage; a multiplexer configured to receive the one or more supply voltages and configured to output a selected supply voltage selected from the one or more supply voltages; an analog-to-digital converter (ADC) configured to convert the internal reference voltage and a scaled version of the selected supply voltage into one or more digital values; and a digital comparator. The digital comparator is configured to: generate a calibrated measurement result using the one or more digital values, a first stored digital value of the internal reference voltage, and a second stored digital value of an external reference voltage; compare the calibrated measurement result with a pre-determined range; and in response to detecting that the calibrated measurement result is outside the pre-determined range, set an error flag indicating a fault condition of the memory device.

Example 2. The memory device of Example 1, wherein the first stored digital value and the second stored digital value are ADC outputs for the internal reference voltage and the external reference voltage, respectively, generated during factory testing of the memory device and stored in the memory device before the memory device is deployed in the field.

Example 3. The memory device of Example 2, wherein the external reference voltage has a higher accuracy than the internal reference voltage.

Example 4. The memory device of Example 2, wherein the power management circuit comprises an input terminal configured to receive the external reference voltage during the factory testing of the memory device.

Example 5. The memory device of Example 4, wherein the internal voltage reference is a bandgap voltage reference.

Example 6. The memory device of Example 1, further comprising a controller, wherein the controller is configured to: send the pre-determined range to the power management circuit; and receive the error flag from the power management circuit.

Example 7. The memory device of Example 6, wherein the controller is further configured to: in response to receiving the error flag, instruct the memory device to repeat a previous memory access operation of the memory array.

Example 8. The memory device of Example 6, wherein the controller is further configured to: in response to receiving the error flag, reset the power management circuit.

Example 9. The memory device of Example 6, further comprising: an input/output (I/O) driver circuit coupled to the controller; and I/O pads coupled to the I/O driver circuit for communication between the controller and an external device.

Example 10. The memory device of Example 1, wherein the power management circuit further comprises a scaling circuit coupled between the multiplexer and the ADC, and is configured to scale the selected supply voltage by a scaling factor.

Example 11. In an embodiment, an integrated circuit (IC) device comprises: a memory array comprising memory cells; a controller coupled to the memory array; and a power management circuit coupled to the memory array and the controller, the power management circuit comprising: a voltage supply circuit configured to provide supply voltages to the memory array; a multiplexer coupled to the voltage supply circuit and configured to output a selected supply voltage that is selected from the supply voltages; an internal voltage reference circuit configured to provide an internal reference voltage; an analog-to-digital converter (ADC) configured to convert the internal reference voltage and a scaled version of the selected supply voltage into ADC outputs; and a digital comparator. The digital comparator is configured to: generate a calibrated measurement result using the ADC outputs, a first pre-stored digital value of the internal reference voltage, and a second pre-stored digital value of an external reference voltage; determine whether the calibrated measurement result is within a pre-determined range; and in response to determining that the calibrated measurement result is outside the pre-determined range, set an error flag indicating a fault condition of the IC device.

Example 12. The IC device of Example 11, wherein the power management circuit is configured to send the error flag to the controller.

Example 13. The IC device of Example 12, wherein the controller is configured to initiate an error recovery operation for the IC device in response to the error flag.

Example 14. The IC device of Example 13, wherein initiating the error recovery operation comprises resetting the power management circuit or repeating a previous memory access operation of the memory array.

Example 15. The IC device of Example 11, wherein the digital comparator is configured to generate the calibrated measurement result using a conversion function $f$ (A, B, $A_{sort}$, $K_{sort}$), wherein A is a first ADC output for the internal reference voltage, B is a second ADC output for the scaled version of the selected supply voltage, $A_{sort}$ is the first pre-stored digital value of the internal reference voltage, and $K_{sort}$ is the second pre-stored digital value of the external reference voltage, wherein the external reference voltage has a higher accuracy than the internal reference voltage.

Example 16. The IC device of Example 15, wherein the first pre-stored digital value and the second pre-stored digital value are ADC outputs for the internal reference voltage and the external reference voltage, respectively, generated during factory testing of the IC device and stored in the IC device before the IC device is deployed in the field.

Example 17. In an embodiment, a method of operating a memory device comprises: supplying one or more supply voltages to a memory array; and monitoring the one or more supply voltages, comprising: selecting, from the one or more supply voltages, a selected supply voltage; converting, using an analog-to-digital converter (ADC), an internal reference voltage of the memory device and a scaled version of the selected supply voltage into one or more digital values; generating a calibrated measurement result using the one or more digital values; and determining whether the calibrated measurement result is within a pre-determined range.

Example 18. The method of Example 17, further comprising: in response to determining that the calibrated measurement result is outside the pre-determined range, setting an error flag indicating a fault condition of the memory device.

Example 19. The method of Example 18, further comprising: initiating a recovery operation in response to setting the error flag, wherein initiating the recovery operation comprises repeating a previous memory access operation of the memory array or resetting a power management circuit of the memory device.

Example 20. The method of Example 17, wherein generating the calibrated measurement result comprises: generating the calibrated measurement result using a conversion function $f$ (A, B, $A_{sort}$, $K_{sort}$), wherein A is a first digital value of the internal reference voltage converted by the ADC, B is a second digital value of the scaled version of the selected supply voltage converted by the ADC, $A_{sort}$ is a first pre-stored digital value of the internal reference voltage, and $K_{sort}$ is a second pre-stored digital value of an external reference voltage, wherein the external reference voltage has a higher accuracy than the internal reference voltage.

Example 21. The method of Example 20, wherein the first pre-stored digital value and the second pre-stored digital value are ADC outputs for the internal reference voltage and the external reference voltage, respectively, generated during factory testing of the memory device and stored in the memory device before the memory device is deployed in the field.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A memory device comprising:
   a memory array comprising memory cells; and
   a power management circuit for the memory array, comprising:
   a voltage supply configured to provide one or more supply voltages to the memory array;
   an internal voltage reference configured to provide an internal reference voltage, wherein the internal reference voltage has a constant nominal value and is uncorrelated with the one or more supply voltages;

a multiplexer configured to receive the one or more supply voltages and configured to output a selected supply voltage selected from the one or more supply voltages;

an analog-to-digital converter (ADC) configured to convert the internal reference voltage and a scaled version of the selected supply voltage into one or more digital values; and a digital comparator configured to:
generate a calibrated measurement result using the one or more digital values, a first stored digital value of the internal reference voltage, and a second stored digital value of an external reference voltage;
compare the calibrated measurement result with a pre-determined range; and
in response to detecting that the calibrated measurement result is outside the pre-determined range, set an error flag indicating a fault condition of the memory device.

2. The memory device of claim 1, wherein the first stored digital value and the second stored digital value are ADC outputs for the internal reference voltage and the external reference voltage, respectively, generated during factory testing of the memory device and stored in the memory device before the memory device is deployed in the field.

3. The memory device of claim 2, wherein the external reference voltage has a higher accuracy than the internal reference voltage.

4. The memory device of claim 2, wherein the power management circuit comprises an input terminal configured to receive the external reference voltage during the factory testing of the memory device.

5. The memory device of claim 4, wherein the internal voltage reference is a bandgap voltage reference.

6. The memory device of claim 1, further comprising a controller, wherein the controller is configured to:
send the pre-determined range to the power management circuit; and
receive the error flag from the power management circuit.

7. The memory device of claim 6, wherein the controller is further configured to:
in response to receiving the error flag, instruct the memory device to repeat a previous memory access operation of the memory array.

8. The memory device of claim 6, wherein the controller is further configured to:
in response to receiving the error flag, reset the power management circuit.

9. The memory device of claim 6, further comprising:
an input/output (I/O) driver circuit coupled to the controller; and
I/O pads coupled to the I/O driver circuit for communication between the controller and an external device.

10. The memory device of claim 1, wherein the power management circuit further comprises a scaling circuit coupled between the multiplexer and the ADC, and is configured to scale the selected supply voltage by a scaling factor.

11. An integrated circuit (IC) device comprising:
a memory array comprising memory cells;
a controller coupled to the memory array; and
a power management circuit coupled to the memory array and the controller, the power management circuit comprising:
a voltage supply circuit configured to provide supply voltages to the memory array;
a multiplexer coupled to the voltage supply circuit and configured to output a selected supply voltage that is selected from the supply voltages;
an internal voltage reference circuit configured to provide an internal reference voltage, wherein the internal reference voltage has a constant nominal value and is uncorrelated with the supply voltages;
an analog-to-digital converter (ADC) configured to convert the internal reference voltage and a scaled version of the selected supply voltage into ADC outputs; and
a digital comparator configured to:
generate a calibrated measurement result using the ADC outputs, a first pre-stored digital value of the internal reference voltage, and a second pre-stored digital value of an external reference voltage;
determine whether the calibrated measurement result is within a pre-determined range; and
in response to determining that the calibrated measurement result is outside the pre-determined range, set an error flag indicating a fault condition of the IC device.

12. The IC device of claim 11, wherein the power management circuit is configured to send the error flag to the controller.

13. The IC device of claim 12, wherein the controller is configured to initiate an error recovery operation for the IC device in response to the error flag.

14. The IC device of claim 13, wherein initiating the error recovery operation comprises resetting the power management circuit or repeating a previous memory access operation of the memory array.

15. The IC device of claim 11, wherein the digital comparator is configured to generate the calibrated measurement result using a conversion function $f(A, B, A_{sort}, K_{sort})$, wherein A is a first ADC output for the internal reference voltage, B is a second ADC output for the scaled version of the selected supply voltage, $A_{sort}$ is the first pre-stored digital value of the internal reference voltage, and $K_{sort}$ is the second pre-stored digital value of the external reference voltage, wherein the external reference voltage has a higher accuracy than the internal reference voltage.

16. The IC device of claim 15, wherein the first pre-stored digital value and the second pre-stored digital value are ADC outputs for the internal reference voltage and the external reference voltage, respectively, generated during factory testing of the IC device and stored in the IC device before the IC device is deployed in the field.

17. A method of operating a memory device, the method comprising:
supplying one or more supply voltages to a memory array; and
monitoring the one or more supply voltages, comprising:
selecting, from the one or more supply voltages, a selected supply voltage;
converting, using an analog-to-digital converter (ADC), an internal reference voltage of the memory device and a scaled version of the selected supply voltage into one or more digital values, wherein the internal reference voltage has a constant nominal value and is uncorrelated with the one or more supply voltages;
generating a calibrated measurement result using the one or more digital values, wherein generating the calibrated measurement result comprises generating the calibrated measurement result using a conversion function $f(A, B, A_{sort}, K_{sort})$, wherein A is a first digital value of the internal reference voltage converted by the ADC, B is a second digital value of the scaled version of the selected supply voltage converted by the ADC, $A_{sort}$ is a first pre-stored digital value of the internal reference voltage, and $K_{sort}$ is a second pre-stored digital value of an external reference voltage, wherein the external reference voltage has a higher accuracy than the internal reference voltage; and determining whether the calibrated measurement result is within a pre-determined range.

18. The method of claim 17, further comprising:
in response to determining that the calibrated measurement result is outside the pre-determined range, setting an error flag indicating a fault condition of the memory device.

19. The method of claim 18, further comprising:
initiating a recovery operation in response to setting the error flag, wherein initiating the recovery operation comprises repeating a previous memory access operation of the memory array or resetting a power management circuit of the memory device.

20. The method of claim 17, wherein the first pre-stored digital value and the second pre-stored digital value are ADC outputs for the internal reference voltage and the external reference voltage, respectively, generated during factory testing of the memory device and stored in the memory device before the memory device is deployed in the field.

* * * * *